United States Patent [19]
Buechele et al.

[11] Patent Number: 5,925,414
[45] Date of Patent: *Jul. 20, 1999

[54] NOZZLE AND METHOD FOR EXTRUDING CONDUCTIVE PASTE INTO HIGH ASPECT RATIO OPENINGS

[75] Inventors: Alvin Wilbur Buechele, Clinton Corners; John Thomas Butler, Hopewell Junction, both of N.Y.

[73] Assignee: International Business Corpration, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/799,612

[22] Filed: Feb. 12, 1997

Related U.S. Application Data

[62] Division of application No. 08/753,127, Nov. 20, 1996, abandoned.

[51] Int. Cl.[6] ................................ B05D 1/32; B05D 5/00
[52] U.S. Cl. .......................... 427/282; 427/96; 118/213; 118/301
[58] Field of Search ........................... 427/96, 282, 307; 118/213, 301, 406

[56] References Cited

U.S. PATENT DOCUMENTS

| | | | |
|---|---|---|---|
| 3,949,666 | 4/1976 | Zimmer | 101/119 |
| 3,987,724 | 10/1976 | Zimmer | 101/119 |
| 4,604,678 | 8/1986 | Hagner | 361/401 |
| 4,622,239 | 11/1986 | Schoenthaler et al. | 427/96 |
| 4,636,406 | 1/1987 | Leicht | 427/96 |
| 4,665,723 | 5/1987 | Zimmer | 68/200 |
| 4,693,209 | 9/1987 | Leicht | 118/213 |
| 5,184,399 | 2/1993 | Ueno et al. | 29/846 |
| 5,294,459 | 3/1994 | Hogan et al. | 427/96 |
| 5,308,644 | 5/1994 | Kawakami et al. | 427/96 |
| 5,350,600 | 9/1994 | Kubota | 427/256 |
| 5,387,044 | 2/1995 | Accardo | 401/5 |
| 5,478,700 | 12/1995 | Gaynes et al. | 430/315 |

OTHER PUBLICATIONS

S. W. Cornell, et al., "Extrusion Screening Nozzle", IBM Technical Disclosure Bulletin vol. 14, No. 3, Aug. 1971, p. 739.

*Primary Examiner*—Shrive Beck
*Assistant Examiner*—Michael Barr
*Attorney, Agent, or Firm*—Dale M. Crockatt; Daryl K. Neff

[57] ABSTRACT

A nozzle apparatus and method of use for extruding a conductive paste through a stencil or screen onto a substrate are disclosed. The nozzle includes a body and a conformable insert for contacting the screen. The method comprises the steps of obtaining a substrate and a patterned screen, contacting the screen with a nozzle comprising a nozzle body and a conformable nozzle insert, and extruding a paste through the nozzle and screen onto the substrate. The apparatus and method are particularly useful for producing patterned lines from extruded pastes in the manufacture of microelectronic components, and are even more particularly adapted for use in producing patterns in substrates having high aspect ratio openings.

8 Claims, 4 Drawing Sheets

NOZZLE AND METHOD FOR EXTRUDING CONDUCTIVE PASTE INTO HIGH ASPECT RATIO OPENINGS

RELATED APPLICATION

The application is a division of application Ser. No. 08/753,127, filed Nov. 20, 1996 now abandoned. U.S. patent application Ser. No. 08/753,129, filed Nov. 6, 1996, entitled "Nozzle Apparatus for Extruding Conductive Paste" assigned to the assignee hereof, discloses a similar nozzle apparatus and method of use.

BACKGROUND OF THE INVENTION

1. Field of the Invention

This invention generally relates to the field of coating apparatus for conductive pastes, and more particularly, to a method and apparatus for extruding a conductive paste through a stencil or screen.

2. Discussion of Related Art

In the fabrication of substrates and carriers for microelectronic components such as integrated circuit chips, the screen printing of lines of conductive paste onto substrates or sheets is a well known technique. In practice, a mask is placed in intimate contact with a substrate, and a conductive paste is then applied. Screening masks are typically thin sheets of metal such as molybdenum, steel, or copper, having a pattern of voids or openings through which the paste is passed. The voids correspond to the desired pattern of lines to be formed on a device.

There are several well known, general, techniques for applying conductive paste. For example, conductive paste may be deposited in a puddle or mass on screening mask, and a squeegee blade moved across the mask to force the paste into the stencil openings and on to the substrate. Alternatively, the screening mask is contacted with a nozzle having an elongate opening for extruding paste into the stencil openings. The nozzle may comprise an integral squeegee blade for wiping, or a separate blade may be used.

Nozzles and methods for their use are also known. The following references illustrate the state of the pertinent art.

U.S. Pat. No. 4,622,239 to Schoenthaler, et al., discloses a nozzle apparatus having elastomeric blades.

U.S. Pat. Nos. 4,636,406 and 4,693,209 to Leicht disclose a method and nozzle apparatus for dispensing solder paste.

U.S. Pat. No. 4,665,723 to Zimmer discloses a nozzle apparatus for dispensing a liquid on a moving web.

U.S. Pat. No. 5,387,044 to Accardo discloses a nozzle apparatus comprising a removable squeegee blade.

U.S. Pat. No. 5,478,700 to Gaynes, et al., discloses a nozzle apparatus having a pair of flexible nozzle lips.

Finally, S. W. Cornell, et al., disclose in the IBM Technical Disclosure Bulletin, Vol. 14(3), 739, (August 1971) a nozzle apparatus having a Teflon nozzle insert.

Much of the prior art has certain deficiencies or disadvantages. One disadvantage is damage and wear to masks caused when hard materials are used to fabricate the contacting element of some nozzles. Another disadvantage is the high-cost associated with fabricating nozzle contacting elements to very tight tolerances to maintain an effective extrusion seal. A third disadvantage is the loss of paste through nozzle end leakage during screening. Additionally, many known nozzle designs necessitate continuous rapid cleaning and drying of masks after screening in a separate step. Finally, the complete filling of deep or high aspect ratio holes or vias is often difficult. Extrusion screening processes are affected by many variables. The changing of certain process variables to achieve a complete via fill is not always successful or predictable. For example, it is possible to increase wipe time, however screening tool throughput is lowered. Paste pressure may be increased, however the seal between the nozzle and the screen or mask is not maintained and paste leaks result. Lowering paste viscosity may result in poor quality screened lines. Thus, the adjusting of the aforesaid parameters is not desirable.

It would thus be desirable to provide an improved nozzle apparatus and method for use which provides a solution to the aforesaid and other deficiencies and disadvantages.

SUMMARY OF THE INVENTION

An object of the present invention is to overcome the problems in the art discussed above.

Another object of the present invention is to provide an a nozzle apparatus which includes a body and a conformable insert for contacting the screen surface, which apparatus is particularly adapted for use in producing patterns in substrates having high aspect ratio vias.

Another object of the present invention is to provide an improved method of use for a nozzle apparatus which includes a body and a conformable insert for contacting the screen surface, which method is particularly adapted for use in producing patterns in substrates having high aspect ratio vias.

Yet another object of the present invention is to provide a nozzle apparatus which forms a positive seal against the screen or mask to reduce paste waste, which apparatus is particularly adapted for use in producing patterns in substrates having high aspect ratio openings.

Still yet another object of the present invention is to provide an improved method of use for a nozzle apparatus which forms a positive seal against the screen or mask to reduce paste waste, which method is particularly adapted for use in producing patterns in substrates having high aspect ratio openings.

Thus, according to the present invention, a nozzle for extruding a paste through a screen and onto a substrate comprises the elements of:

(a) a nozzle body having an inlet, an elongate outlet formed to receive an insert, and an internal passage in communication therewith; and (b) an insert formed to compliantly and sealably mount to the nozzle body outlet, having a flat surface for conformably contacting the screen, and having an elongate slit therein for the extrusion of paste.

The insert will have an elongate slit characterized by an opening width in the range from about 0.093 inches to about 0.180 inches. In the alternative, the insert will have an elongate slit wherein the ratio of the width of said elongate slit to the width of said substrate holes is in the range from about 18 to about 50.

In addition, according to the present invention, a method for producing at least one patterned feature of extruded paste on a substrate comprises the steps of:

(a) obtaining a substrate having a patterned screen thereon;

(b) contacting the screen with a nozzle comprising a nozzle body having an inlet, an elongate outlet formed to receive an insert, and an internal passage in communication therewith, and a nozzle insert formed to compliantly and sealably mount to the nozzle body outlet, having a flat surface for conformably contacting the screen, and having an elongate slit having the aforesaid characteristics for the extrusion of paste; and (c) extruding a paste through the nozzle and screen onto the substrate.

DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, in which.

DETAILED DESCRIPTION OF THE PREFERRED EMBODIMENTS

U.S. patent application Ser. No. 08/753,129, entitled "Nozzle Apparatus for Extruding Conductive Paste" (attorney docket number FI9-96-108) discloses a similar nozzle apparatus and method of use. The disclosure thereof is incorporated by reference into this application.

Figure 1:
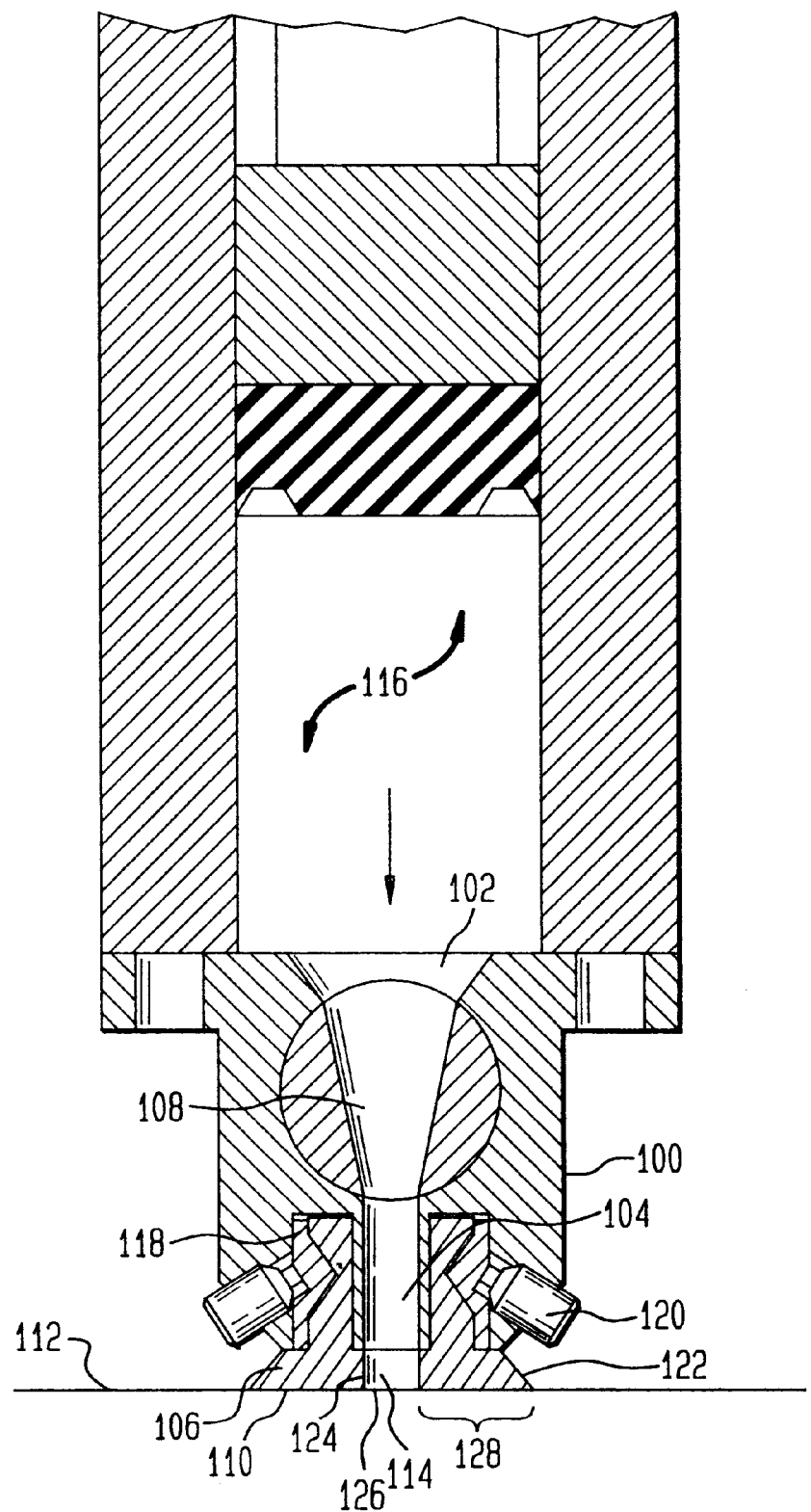
FIG. 1 shows a cross sectional end view of a nozzle body, nozzle insert, and support strips which is useful in the present invention.
Figure 2:
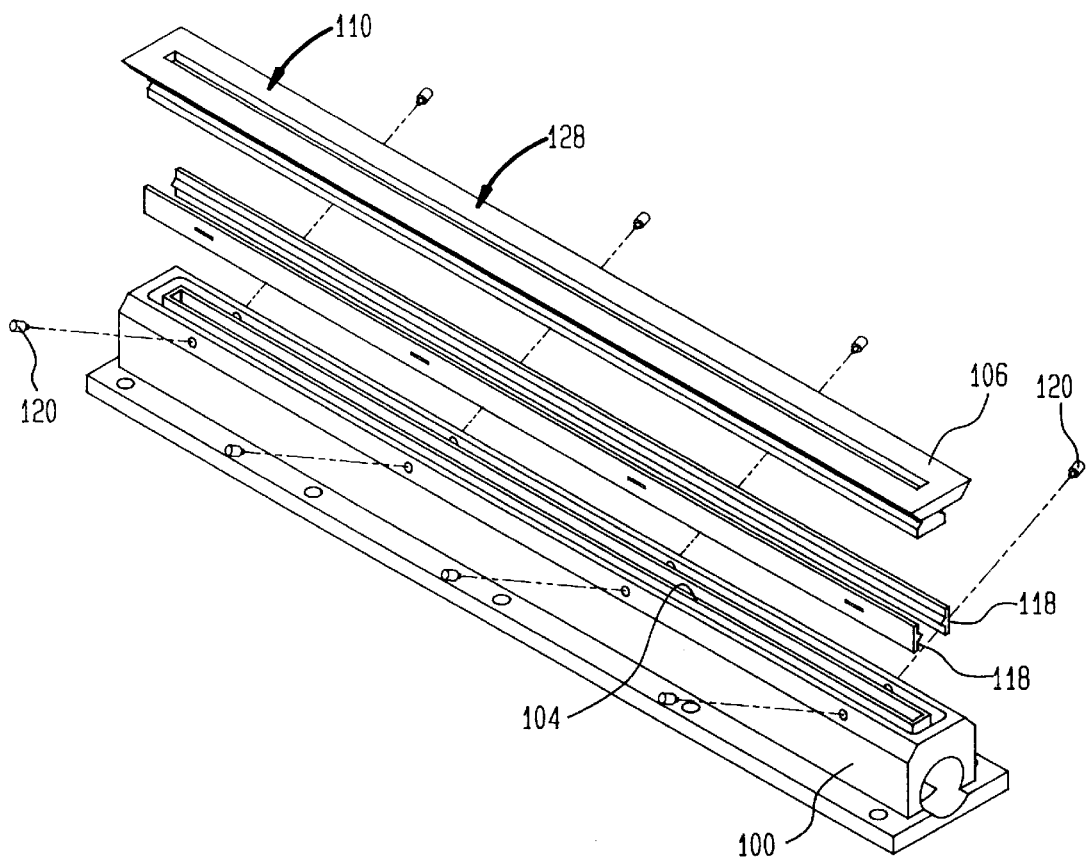
FIG. 2 shows a cross sectional end view of a nozzle body, the nozzle insert of a preferred embodiment, and support strips which is useful in the present invention.

Referring to FIG. 1, there is shown an improved nozzle for extruding a paste through a screen and onto a substrate according to the present invention. The nozzle comprises a nozzle body 100 having an inlet (not shown), an elongate outlet 104 formed to receive a nozzle insert 106, and an internal passage 108 in communication with the inlet and outlet 104. The nozzle further comprises the nozzle insert 106, which is formed to compliantly and sealably mount to the nozzle body outlet 104. The insert has a contacting surface which in the embodiment shown in FIG. 1 is flat, for conformably contacting the screen 112. The insert has an elongate slit 114 for the extrusion of paste 116. The insert 106 may comprise a material such as polyurethane, an elastomer, a thermoplastic, natural rubber, silicone, Teflon (Trademark of E. I. Dupont de Nemours & Co.) tetrafluoroethylene (TFE), or other similar polymers. The nozzle may optionally comprise a plurality of support strips 118 fixably mounted in the nozzle body 100 to retain the insert 106 in the nozzle body 100. The support strips 118 may be fixably mounted by many well known means including set screws 120, glues (not shown), or various other bonding means. Alternatively, the insert 106 may be fixably mounted without the use of support strips 118, such as by gluing or bonding directly to the nozzle body 100.

It has been surprisingly found that when the opening of the elongate slit is increased in width, the nozzle insert of the present invention is particularly adapted for use in producing patterns in substrates having high aspect ratio openings. In the art of screening microelectronic substrates, it is common to have via hole diameters in the range from about 0.004 inches to about 0.008 inches. Via hole depths commonly range from about 0.006 inches to about 0.020 inches. In the present invention, by high aspect ratio vias is meant one or more openings or vias characterized by a via depth to via width ratio of greater than about 2 when the via opening width is about 0.005 inches. When used in ordinary paste screening processes, insert 160 may have an elongate slit characterized by an opening width as narrow as 0.050 inches. When adapted for substrates having high aspect ratio via holes, insert 160 will have an elongate slit characterized by an opening width in the range from about 0.093 inches to about 0.180 inches. In the alternative, the insert will have an elongate slit wherein the ratio of the width of said elongate slit to the width of said substrate holes is in the range from about 18 to about 50. It has also been found that it is undesirable to have a very large opening as excessive paste will remain on the screen at the end of the wipe cycle leading to waste.

FIG. 1 further shows a preferred embodiment of the insert 106 which has at least one beveled working edge 122.

In an alternative even more preferred embodiment, the insert flat surface 110 comprises a region 128 extending beyond each end of the elongate opening 114 to dynamically seal to the screen 112.

Figure 3:
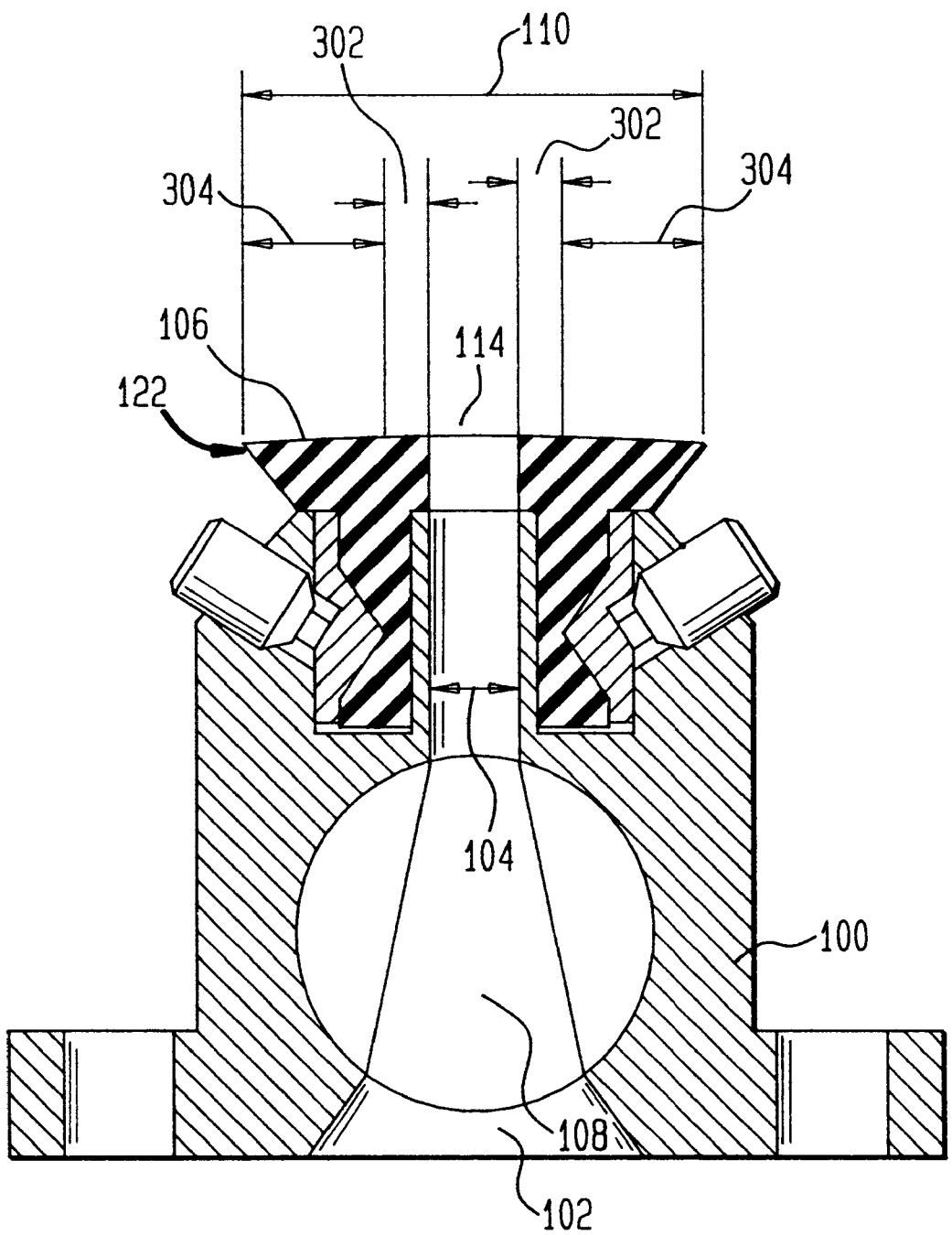
FIG. 3 shows a partial perspective, exploded view of a nozzle body, support strips, and nozzle insert, and particularly shows the flat surface for contacting a screen, according to the present invention.
Figure 4:
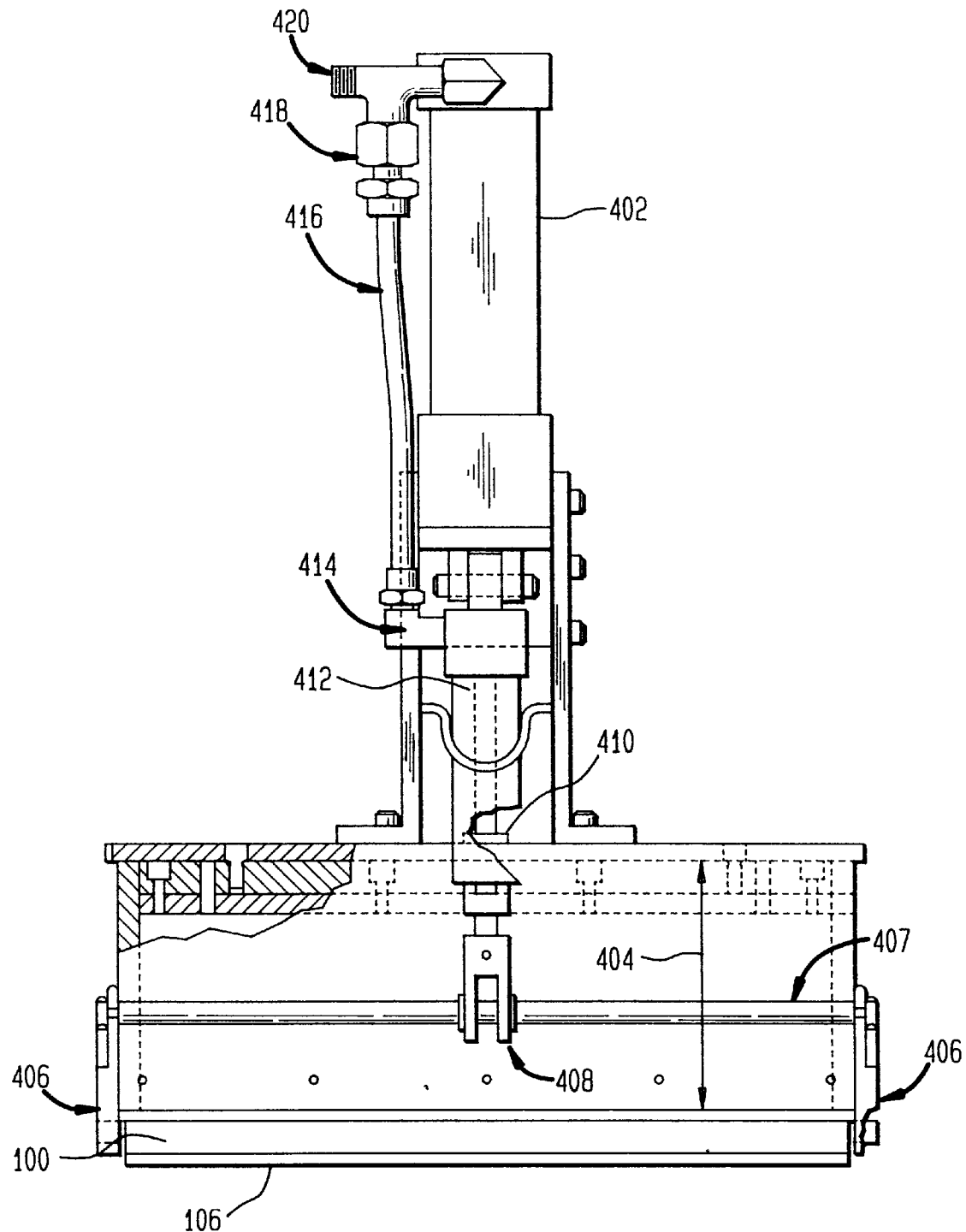
FIG. 4 shows a side external view of a nozzle body, nozzle insert, paste supply means and paste flow controlling apparatus according to the present invention.

Another even more preferred embodiment is shown in FIG. 3, wherein the nozzle comprises a nozzle body 100, having an inlet 102, an elongate outlet 104 formed to receive a nozzle insert 106, and an internal passage 108 in communication with the inlet and outlet 104. The nozzle insert 106 is also shown, and is formed to compliantly and sealably mount to the nozzle body outlet 104. The insert has a contacting surface 110 comprising a first flat region 302 extending from the opening 114 towards the beveled working edge 122, and a second surface 304 which is angled. To further illustrate but not limit such an embodiment, the first flat region 302 may have a width in the range from about 0.020 inches to about 0.060 inches, and the second surface 304 may be disposed at an angle of about 2 to about 4 degrees from the first surface 302. A nozzle insert of such design has been unexpectedly found to improve the consistency of the nozzle to screening mask seal and to increase the effective life of a nozzle insert.

In operation, the nozzle may be used to produce at least one patterned feature of extruded paste on a substrate according to the following process. A substrate having a patterned screen thereon is obtained; both are well known in the art. The nozzle assembly is brought proximate to the screen such that the nozzle insert contacts the screen to form a seal between the insert and screen. Paste is then extruded through the elongate slit in the nozzle insert so as to pass through the screen and patternwise onto the substrate.

The following Tables 1 and 2 show examples and comparative examples of paste extrusion methods in which insert opening widths and certain process parameters are varied for substrates with vias having any one of 3 different aspect ratios. In each example, certain process parameters were kept constant while those listed in the tables below were varied. The nozzle insert to screen contact force was held constant in the range from about 15 to about 20 pounds. The same paste composition was used for all experiments and had a viscosity in the range from about 50 to about 55 Pascal seconds. The length of the wiped area was 195 mm. The examples of Table 1 show useful process conditions, the comparative examples of Table 2 show process conditions leading to undesirable results.

TABLE 1

Examples of Useful Process Conditions

| Via Depth/ Diameter | Insert Opening Width (steel/Polyurethane)[1] | Extrusion Pressure | Wipe Time |
| --- | --- | --- | --- |
| .006"/.0047" | .093"/.093" | 85 psi. | 20 sec. |
| .008"/.0047" | .110"/.110" | 85 psi. | 12 sec. |
| .008"/.0047" | .093"/.180" | 85 psi. | 6 sec. |
| .008"/.0040" | .110"/.110" | 85 psi. | 16 sec. |
| .008"/.0040" | .093"/.180" | 70 psi. | 12 sec. |
| .011"/.0047" | .093"/.180" | 70 psi. | 12 sec. |

Notes to Table 1:
1. In the category "Steel/Polyurethane" the first value is the opening width of the elongate outlet in the nozzle body and the second value is the opening width of the elongate slit in the nozzle insert.

TABLE 2

Comparative Examples of Undesirable Parameters

| Via Depth/ Diameter | Insert Opening Width (steel/ Polyurethane) | Extrusion Pressure | Wipe Time | Via Fill |
| --- | --- | --- | --- | --- |
| .011"/.0047" | .070"/.070" | 90–100 psi.[1] | 34 sec. | —[2] |
| .008"/.0040" | .093"/.093" | 100 psi.[1] | 20 sec. | —[2] |
| .011"/.0047" | .093"/.093" | 100 psi.[1] | 20 sec. | —[2] |
| .011"/.0047" | .110"/.110" | 100 psi.[1] | 10 sec. | good |

Notes to Table 2:
1. 100 psi extrusion pressures tend to cause leakage of paste from the nozzle insert to screen seal.
2. Under stated conditions, vias were not completely filled.

Referring to the tables above, it will be understood that increasing the extrusion pressure causes undesirable paste leakage. Furthermore, it will be understood that absent increasing the insert slit opening width, the translational speed of the nozzle must be unduly slowed to assure complete filling of the vias. Thus, it is useful to increase the insert elongate slit width to produce acceptable patterns in substrates having high aspect ratio openings.

While the invention has been particularly shown and described with reference to specific embodiments thereof, it will be understood by those skilled in the art that various changes in form and detail may be made thereto, and that other embodiments of the present invention beyond embodiments specifically described herein may be made or practiced without departing from the spirit of the invention. Similarly, other changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. A method for producing at least one patterned feature of extruded paste on an essentially planar microelectronic substrate having high aspect ratio vias, said method comprising the steps of:
   (a) obtaining a substrate having high aspect ratio vias characterized by a via depth to via width ratio of greater than about 2;
   (b) contacting the substrate with an essentially planar patterned screen;
   (c) contacting the screen with a nozzle comprising a nozzle body having an inlet, an elongate outlet formed to receive an insert, and an internal passage in communication therewith, and a nozzle insert formed to compliantly and sealably mount to the nozzle body outlet, said insert having a flat surface located adjacent to said outlet for conformably contacting said essentially planar screen, having a second surface joined to and angled away from said flat surface at a position away from said outlet, and having an elongate slit therein for the extrusion of paste, wherein said second surface is angled in the range of about 2 to about 4 degrees away from said flat surface; and
   (d) extruding a paste through said nozzle and said screen onto said substrate.

2. The method of claim 1 wherein the nozzle further comprises a plurality of support strips fixably mounted in the nozzle body to retain the insert in the nozzle body.

3. The method of claim 1 wherein the nozzle insert flat surface comprises a region extending beyond each end of the elongate opening to dynamically seal to the screen.

4. The method of claim 3 wherein said flat surface of said insert has width between about 0.020 inches and about 0.060 inches.

5. The method of claim 1 wherein the vias of the substrate have an opening width of not greater than about 0.040 inches.

6. The method of claim 1 wherein said insert further comprises a beveled edge.

7. The method of claim 1 wherein said elongate slit has an opening width in the range from about 0.093 inches to about 0.180 inches.

8. The method of claim 1 wherein said elongate slit has width in a range between about 18 and about 50 multiples of said predetermined via width.

* * * * *

UNITED STATES PATENT AND TRADEMARK OFFICE
CERTIFICATE OF CORRECTION

PATENT NO. : 5,925,414
DATED : July 20, 1999
INVENTOR(S): Alvin Wilbur Buechele, John Thomas Butler It is certified that error appears in the above-identified patent and that said Letters Patent are hereby corrected as shown below:

In Column 1, on the front page of the patent under the Assignee please remove "International Business Corpration" and insert -- International Business Machines Corporation --.

Signed and Sealed this

Eighth Day of February, 2000

Attest:

Attesting Officer

Q. TODD DICKINSON

Commissioner of Patents and Trademarks